United States Patent [19]

Bell et al.

[11] Patent Number: 5,320,271
[45] Date of Patent: Jun. 14, 1994

[54] SPLASH PROTECTOR RAILS FOR PRINTED WIRING BOARDS

[75] Inventors: Hans Bell; Raimund Exner, both of Berlin, Fed. Rep. of Germany

[73] Assignee: DeTeWe-Deutsche Telephonwerke AG&Co., Berlin, Fed. Rep. of Germany

[21] Appl. No.: 36,830

[22] Filed: Mar. 25, 1993

[30] Foreign Application Priority Data

Mar. 25, 1992 [DE] Fed. Rep. of Germany ....... 9204205

[51] Int. Cl.$^5$ .............................................. B23K 37/04
[52] U.S. Cl. ..................................... 228/49.5; 228/57; 228/215; 228/37; 269/903
[58] Field of Search ................... 228/37, 49.5, 260, 57, 228/215; 269/903; 198/836.3, 836.2, 687, 680, 584

[56] References Cited

U.S. PATENT DOCUMENTS 4,457,466 7/1984 Ahmann et al. ...................... 228/57

FOREIGN PATENT DOCUMENTS 0206231 12/1986 European Pat. Off. .
3039075 10/1981 Fed. Rep. of Germany .
3147380 6/1983 Fed. Rep. of Germany .
3318381 11/1984 Fed. Rep. of Germany ...... 198/687
2625402 6/1989 France .................................. 228/37

OTHER PUBLICATIONS

"Splash Shield," *IBM Tech. Discl. Bull.*, vol. 29, No. 11 (Apr. 1987) pp. 5068-5069.

*Primary Examiner*—Paula A. Bradley
*Assistant Examiner*—Jeffrey T. Knapp
*Attorney, Agent, or Firm*—Herbert L. Lerner; Laurence A. Greenberg

[57] ABSTRACT

A splash protector assembly for printed wiring boards includes splash protector rails for permitting printed wiring boards to be coupled together without additional aids as they are conveyed in a given conveying direction across different conveying planes through soldering machines. The splash protector rails include successive front and rear splash protector rails as seen in the given conveying direction. Each of the splash protector rails are L-shaped and define a longer leg being in an upright position during use, and a shorter leg. Each of the splash protector rails have springs for clamping the printed wiring boards. The longer leg of the rear splash protector rail has hooks and the longer leg of the front splash protector has braces for hanging the rear splash protector rail from the front splash protector rail of the next printed wiring board, and the braces prevent the printed wiring boards from becoming unhung as they are conveyed across meeting points of the different conveying planes.

6 Claims, 1 Drawing Sheet

FIG.1
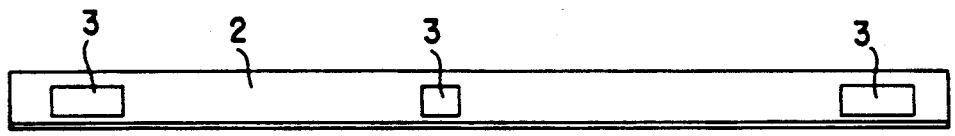
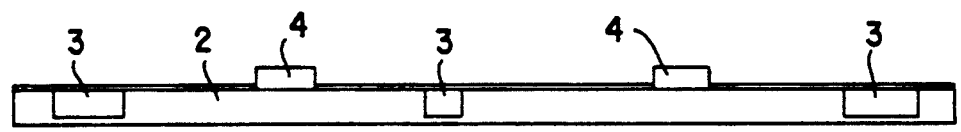
FIG.2
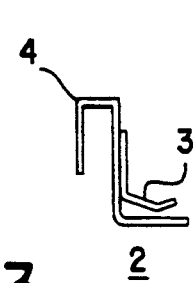
FIG.3
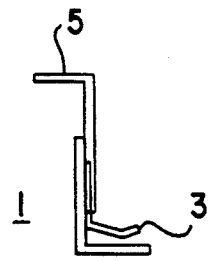
FIG.5
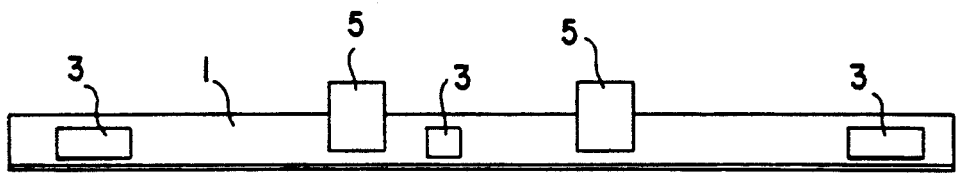
FIG.4
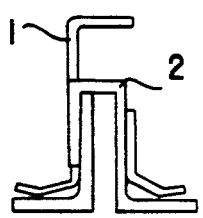
FIG.6

SPLASH PROTECTOR RAILS FOR PRINTED WIRING BOARDS

The invention relates to splash protector rails for printed wiring boards, with which the printed wiring boards can be coupled together without additional aids as they pass through soldering machines.

During wave soldering of printed wiring boards, auxiliary tools are used that prevent solder from travelling onto the top of the printed wiring board during the soldering process. Such auxiliary tools are known as splash protectors or bow (front) protectors, are easy to mount, and are reusable. In order to increase the capacity of wave soldering systems, a plurality of printed wiring boards are secured in a soldering frame which is then moved through the soldering machine, for instance by means of chain conveyors. In the wave soldering, the printed wiring boards are moved along an upwardly inclined conveying plane at an angle of typically up to 12°, and subsequently are conveyed for further processing on a conveyor device that inclines downward at an angle, as is known from German Published, Non-Prosecuted Application DE 30 39 075 A1). Points (kinks) at which the frames are moved at an angle between the conveying planes must be overcome at transitions from conveying horizontally to conveying on an upward slope and a downward slope.

In order to better exploit the capacity of wave soldering systems, the idea suggests itself of guiding the printed wiring boards directly across the solder bath, without fastening them into a frame. In that case, the printed wiring boards must be assured of remaining joined to one another when they overcome the points at which the various conveying planes meet.

It is accordingly an object of the invention to provide splash protector rails for printed wiring boards, which overcome the hereinafore-mentioned disadvantages of the heretofore-known devices of this general type and which create the capability aligning printed wiring boards with simple auxiliary tools, which assure that the printed wiring boards will be held securely together as they move past the points where conveyor planes that are at an angle to one another meet.

With the foregoing and other objects in view there is provided, in accordance with the invention, a splash protector assembly for printed wiring boards, comprising splash protector rails for permitting printed wiring boards to be coupled together without additional aids as they are conveyed in a given conveying direction across different conveying planes through soldering machines; the splash protector rails including successive front and rear splash protector rails as seen in the given conveying direction; each of the splash protector rails being L-shaped and defining a longer leg being in an upright position during use, and a shorter leg; each of the splash protector rails having springs for clamping the printed wiring boards; the longer leg of the rear splash protector rail having hooks and the longer leg of the front splash protector having braces for hanging the rear splash protector rail from the front splash protector rail of the next printed wiring board, and the braces preventing the printed wiring boards from becoming unhung as they are conveyed across points at which the different conveying planes meet.

In accordance with another feature of the invention, each of the front splash protector rails have at least two of the braces, and each of the rear splash detector rails have at least two of the hooks.

In accordance with a further feature of the invention, the hooks are located between the braces when the rails are positioned during use.

In accordance with a concomitant feature of the invention, the braces are located between the hooks when the rails are positioned during use.

Other features which are considered as characteristic for the invention are set forth in the appended claims.

Although the invention is illustrated and described herein as embodied in a splash protector rails for printed wiring boards, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

FIG. 1 is a diagrammatic, elevation view of a rear splash protector rail;

FIG. 2 is a plan view of the rear splash protector rail;

FIG. 3 is an enlarged side-elevational view of the rear splash protector rail;

FIG. 4 is a plan view of the front splash protector rail;

FIG. 5 is an enlarged side-elevational view of the front splash protector rail; and FIG. 6 is an enlarged side-elevational view of the coupled rear and front splash protector rails.

Referring now in detail to the figures of the drawing, in which identical parts have the same reference numerals, there are seen splash protector rails, which include one front splash protector rail 1 and one rear splash protector rail 2 (the terms front and rear refer to the direction of conveyance through a soldering machine), that are used for each printed wiring board. As is seen in FIGS. 3, 5 and 6, the splash protector rails 1, 2 have an L-shaped cross section with a shorter leg that is horizontal and a longer leg that is upright, in the position occupied during use. Springs 3 are mounted on the longer leg of the L-shaped splash protector rails 1, 2. A printed wiring board is held by clamping action between these springs 3 and the shorter leg of the splash protector rails 1, 2.

As is seen in FIGS. 1 and 2, the rear splash protector rail 2 has at least two hooks 4 which enable the rear splash protector rail 2 to be suspending from the front splash protector rail 1 of the next printed wiring board. As is seen in FIGS. 3, 4 and 5, at least two L-shaped braces 5 are disposed on the front splash protector rail 1. The hooks 4 and braces 5 in the example shown are mounted on the splash protector rails 1 and 2 in such a way that after the rear splash protector rail 2 is hung from the front splash protector rail 1 as is seen in FIG. 6, the braces 5 are located between the hooks 4. A different embodiment provides for the converse case, in which the hooks are located between the braces 5. In addition, the hooks 4 and braces 5 may be disposed in such a way that only a minimum lateral play is possible during conveyance of the printed wiring board.

The hooks 4 are constructed in such a way that they permit a free tilting motion of the printed wiring boards independently of one another. The braces 5 prevent the coupled printed wiring board from becoming unhung as it is conveyed across meeting points (kinks) of different conveying planes.

Since the successive printed wiring boards are closely coupled together, the use of the proposed splash protector rails achieves higher throughput through the wave soldering system.

We claim:

1. A splash protector assembly for printed wiring boards, comprising:

splash protector rails for permitting printed wiring boards to be coupled together without additional aids as they are conveyed in a given conveying direction across different conveying planes through soldering machines;

said splash protector rails including successive front and rear splash protector rails as seen in the given conveying direction;

each of said splash protector rails being L-shaped and defining a longer leg being in an upright position during use, and a shorter leg;

each of said splash protector rails having springs for clamping the printed wiring boards;

said longer leg of said rear splash protector rail having hooks and said longer leg of said front splash protector having braces for hanging said rear splash protector rail from said front splash protector rail of the next printed wiring board, and said braces preventing the printed wiring boards from becoming unhung as they are conveyed across points at which the different conveying planes meet.

2. The splash protector rails according to claim 1, wherein each of said front splash protector rails have at least two of said braces, and each of said rear splash detector rails have at least two of said hooks.

3. The splash protector rails according to claim 1, wherein said hooks are located between said braces when said rails are positioned during use.

4. The splash protector rails according to claim 2, wherein said hooks are located between said braces when said rails are positioned during use.

5. The splash protector rails according to claim 1, wherein said braces are located between said hooks when said rails are positioned during use.

6. The splash protector rails according to claim 2, wherein said braces are located between said hooks when said rails are positioned during use.

* * * * *